(12) United States Patent
Eyring et al.

(10) Patent No.: US 12,085,385 B2
(45) Date of Patent: Sep. 10, 2024

(54) DESIGN-ASSISTED LARGE FIELD OF VIEW METROLOGY

(71) Applicant: KLA Corporation, Milpitas, CA (US)

(72) Inventors: Stefan Eyring, Weilburg (DE); Frank Laske, Weilburg (DE)

(73) Assignee: KLA Corporation, Milpitas, CA (US)

( * ) Notice: Subject to any disclaimer, the term of this patent is extended or adjusted under 35 U.S.C. 154(b) by 300 days.

(21) Appl. No.: 17/524,152

(22) Filed: Nov. 11, 2021

(65) Prior Publication Data

US 2023/0108539 A1    Apr. 6, 2023

Related U.S. Application Data

(60) Provisional application No. 63/252,621, filed on Oct. 6, 2021.

(51) Int. Cl.
| | |
|---|---|
| G01B 15/04 | (2006.01) |
| G01B 11/00 | (2006.01) |
| G01B 11/24 | (2006.01) |

(52) U.S. Cl.
CPC .......... G01B 15/04 (2013.01); G01B 11/002 (2013.01); G01B 11/24 (2013.01)

(58) Field of Classification Search
CPC ........ G01B 15/04; G01B 11/002; G01B 11/24
See application file for complete search history.

(56) References Cited

U.S. PATENT DOCUMENTS

| | | |
|---|---|---|
| 5,216,247 A | 6/1993 | Wang et al. |
| 5,841,520 A | 11/1998 | Taniguchi |
| 6,462,343 B1 | 10/2002 | Choo |
| 6,509,750 B1 | 1/2003 | Talbot et al. |
| 6,862,142 B2 | 3/2005 | Lange |
| 6,984,838 B2 | 1/2006 | Kosugi |
| 7,245,354 B2 | 7/2007 | Granik |
| 7,633,041 B2 | 12/2009 | Furman et al. |
| 7,792,351 B1 | 9/2010 | Toth et al. |
| 7,871,004 B2 | 1/2011 | Smith et al. |
| 8,196,068 B2 | 6/2012 | Zhang |
| 10,185,800 B2 | 1/2019 | Eyring et al. |

(Continued)

FOREIGN PATENT DOCUMENTS

| | | |
|---|---|---|
| GB | 2300275 A | 10/1996 |
| JP | 2006278799 A | 10/2006 |
| WO | 2021016407 A1 | 1/2021 |

OTHER PUBLICATIONS

PCT/US2022/045714 International Search Report dated Jan. 30, 2023.

*Primary Examiner* — Nicole M Ippolito
(74) *Attorney, Agent, or Firm* — Suiter Swantz IP

(57) ABSTRACT

A metrology system may receive design data including a layout of fabricated instances of a structure on a sample. The system may further receive detection signals from the metrology tool associated within a field of view including multiple of the fabricated instances of the structure. The system may further generate design-assisted composite data for the structure by combining detection signals from one or more common features of the structure associated with the fabricated instances of the structure within the field of view using the design data. The system may further generate one or more metrology measurements of the structure based on the design-assisted composite data.

41 Claims, 8 Drawing Sheets

(56) References Cited

U.S. PATENT DOCUMENTS

| | | |
|---|---|---|
| 10,473,460 B2 | 11/2019 | Gutman et al. |
| 10,475,179 B1 | 11/2019 | Bishop et al. |
| 2005/0105102 A1 | 5/2005 | Nguyen et al. |
| 2009/0244078 A1 | 10/2009 | Kanai et al. |
| 2011/0202898 A1* | 8/2011 | Kusnadi .............. G03F 7/70516 716/135 |
| 2014/0307949 A1* | 10/2014 | Eyring ................ G03F 7/70633 382/151 |
| 2015/0116717 A1 | 4/2015 | Manassen et al. |
| 2015/0248756 A1* | 9/2015 | Laske ..................... G06T 7/001 382/144 |
| 2017/0016715 A1 | 1/2017 | Heidrich et al. |
| 2019/0179231 A1 | 6/2019 | Laske et al. |
| 2020/0211845 A1 | 7/2020 | Pu et al. |
| 2021/0096061 A1* | 4/2021 | Hill ....................... G06T 7/0004 |

* cited by examiner

DESIGN-ASSISTED LARGE FIELD OF VIEW METROLOGY

CROSS-REFERENCE TO RELATED APPLICATION

The present application claims the benefit under 35 U.S.C. § 119(e) of U.S. Provisional Application Ser. No. 63/252,621, filed Oct. 6, 2021, entitled LFOV Tracing for Critical Dimension, Registration, and Overlay Metrology, which is incorporated herein by reference in the entirety.

TECHNICAL FIELD

The present disclosure relates generally to semiconductor metrology and, more particularly, to metrology of fabricated features using design-assisted averaging.

BACKGROUND

Various metrology steps are routinely performed to monitor aspects of a semiconductor fabrication process. For example, it is often desirable to monitor properties of fabricated structures such as, but not limited to, the size (e.g., critical dimension (CD)), the position of the structures (e.g., the registration or placement error), or the position of certain portions of the structures (e.g., edge placement error associated with placement of one or more edges). Such measurements may then be compared to design specifications. However, a central challenge to such monitoring measurements is to balance measurement quality with measurement speed and/or negative impacts of the measurement. For example, optical metrology techniques typically provide relatively high throughput, but lack the measurement resolution of alternative techniques. By way of another example, particle-based metrology techniques (e.g., scanning electron microscopy (SEM), or the like) may provide relatively high resolution, but may suffer from relatively low throughput and may further induce damage to the sample during a measurement. There is therefore a need to develop systems and methods to cure the above deficiencies.

SUMMARY

A metrology system is disclosed in accordance with one or more illustrative embodiments of the present disclosure. In one illustrative embodiment, the system includes a controller that may be coupled to a scanning metrology tool. In another illustrative embodiment, the controller receives design data including a layout of fabricated instances of a structure on a sample. In another illustrative embodiment, the controller receives detection signals from the metrology tool associated within a field of view including multiple of the fabricated instances of the structure. In another illustrative embodiment, the controller generates design-assisted composite data for the structure by combining detection signals from one or more common features of the structure associated with the fabricated instances of the structure within the field of view using the design data. In another illustrative embodiment, the controller generates one or more metrology measurements of the structure based on the design-assisted composite data.

A metrology system is disclosed in accordance with one or more illustrative embodiments of the present disclosure. In one illustrative embodiment, the system includes a scanning metrology tool to scan an illumination spot along a scan pattern with respect to a sample, where the scan pattern includes a layout of a plurality of fabricated instances of a structure on the sample. In another illustrative embodiment, the system includes a controller. In another illustrative embodiment, the controller receives design data including the layout of the fabricated instances of the structure on the sample. In another illustrative embodiment, the controller receives detection signals from the metrology tool associated within a field of view including multiple of the fabricated instances of the structure. In another illustrative embodiment, the controller generates design-assisted composite data for the structure by combining detection signals from one or more common features of the structure associated with the fabricated instances of the structure within the field of view using the design data. In another illustrative embodiment, the controller generates one or more metrology measurements of the structure based on the design-assisted composite data.

A metrology method is disclosed, in accordance with one or more illustrative embodiments of the present disclosure. In one illustrative embodiment, the method includes receiving design data including a layout of fabricated instances of a structure on a sample. In another illustrative embodiment, the method includes generating detection signals from a metrology tool associated within a field of view including multiple of the fabricated instances of the structure. In another illustrative embodiment, the method includes generating design-assisted composite data for the structure by combining detection signals from one or more common features of the structure associated with the fabricated instances of the structure within the field of view using the design data. In another illustrative embodiment, the method includes generating one or more metrology measurements of the structure based on the design-assisted composite data.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1A:
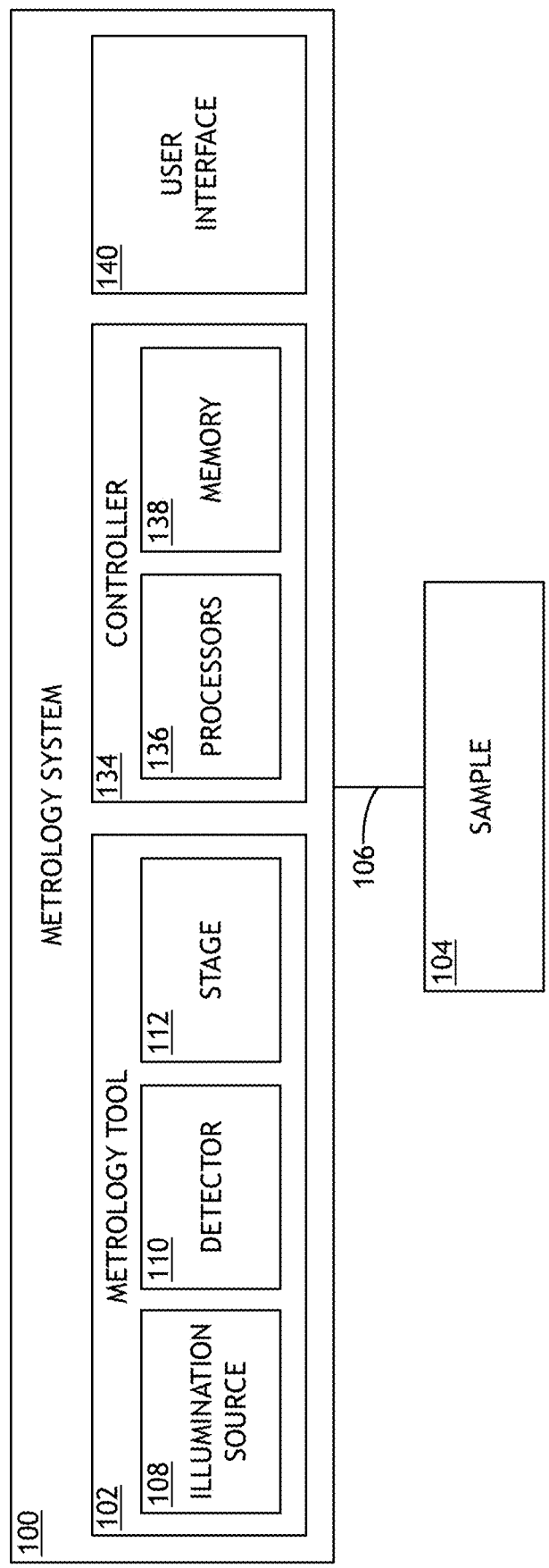
FIG. 1A is a conceptual view of a metrology system providing design-assisted composite data, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for metrology based on design-assisted composite data.

It is contemplated herein that it may be desirable for some types of metrology measurements to mitigate various sources of stochastic noise associated with a fabrication process such as, but not limited to, line edge roughness (LER) or line width roughness (LWR). Common examples include, but are not limited to, dimensional measurements (e.g., critical dimension (CD) measurements), position measurements of fabricated structures (e.g., pattern placement measurements, registration measurements, or the like), overlay measurements (e.g., relative positions of features on one or more layers fabricated using different exposures), or position measurements of certain features (e.g., edge placement measurements). Techniques for mitigating such stochastic noise typically involve averaging measurements at different locations on the structure (e.g., structure-based averaging). However, such structure-based techniques may similarly suffer from low measurement throughput and/or sample damage during a measurement. As a result, users must typically either generate measurements of a low number of structures to provide reasonable throughput or generate measurements of a desired number of structures with a low throughput. In all cases, users must further take steps to limit the energy deposition on the sample during a measurement (e.g., an exposure dose associated with an incident energy per area on the sample), which may negatively impact the measurement sensitivity, or sacrifice some samples during measurement.

Embodiments of the present disclosure are directed to design-assisted metrology in which detection signals associated with multiple instances of a fabricated structure are combined into a single data set, which is referred to herein as design-assisted composite data. For example, design-assisted composite data may be generated by using design data including layout information of instances of a structure of interest across a sample to combine datapoints (e.g., through averaging or any suitable statistical technique) associated with common locations on multiple instances of a structure of interest. As an illustration, common features of a line structure may include, but are not limited to, a left edge, a central portion, and a right edge. Put another way, a metrology tool may generate detection signals associated with multiple (or many) instances of the structure within a field of view (FOV). Design data associated with the intended layout information (e.g., locations and/or orientations of the instances of the structure across the sample) may then be used to identify and combine datapoints that correspond to a common feature on each of the instances of the structure within the FOV. This design-assisted composite data may include any statistical combination of the data from the various instances of the structure such as, but not limited to, average values, median values, or the like. Various metrology measurements of the structure may then be generated using this design-assisted composite data.

Design-assisted composite data may be generated for any type of sample known in the art having repeated instances of a structure of interest. For example, metrology using design-assisted composite data may be generated for semiconductor samples at any stage in a fabrication process. Further, the structures of interest may correspond to device structures and/or dedicated metrology structures (e.g., alignment targets, overlay targets, or the like). By way of another example, metrology using design-assisted composite data may be generated on photomasks (e.g., resists) used to fabricate repeating structures on semiconductor samples at various steps in the fabrication process.

It is contemplated herein that metrology based on design-assisted composite data may be implemented using any type of metrology tool known in the art. In some embodiments, design-assisted composite data is generated using a scanning metrology tool. In this case, the detection signals may be associated with a scan pattern of an illumination beam within the FOV, where the scan pattern is selected to cross the various instances of the structure of interest at common locations in order to provide many measurements of the common locations that may be combined into design-assisted composite data. In some embodiments, design-assisted composite data is generated using an image-based metrology tool. In this case, the detection signals may be generated by illuminating at least the field of view with an illumination beam and capturing an associated image.

Further, the metrology tool may utilize any type of illumination beam known in the art including, but not limited to, photon beams (e.g., light beams) or particle beams (e.g., electron beams, ion beams, neutral particle beams, or the like).

Metrology based on design-assisted composite data as disclosed herein may provide numerous benefits. For example, design-assisted composite data from many instances of a structure of interest across a sample may generally provide substantially more sample points for averaging (or other statistical combination) than possible with traditional structure-based averaging techniques, which results in a high signal to noise ratio (SNR) and sensitive measurements. As an illustration, traditional structure-based averaging may be limited by a length of a structure of interest over an averaging direction and/or an imaging FOV, whereas design-assisted composite data may be formed from any number of instances of the structure.

Further, the use of design-assisted composite data may provide substantial flexibility for selecting the FOV of the measurement to further improve the performance. As an illustration in the context of a scanning metrology tool, metrology using design-assisted composite data may eliminate a need to create a high-resolution image of any particular structure of interest. Rather, a low-noise signal is generated by combining data from measurements of multiple instances of the structure. In this way, metrology using design-assisted composite data may be analogized to phase-locked loop measurements that utilize signal periodicity to provide sensitive measurements. However, it is to be understood that this analogy is merely illustrative and is not limiting. For example, metrology using design-assisted composite data does not require periodic signals of any type, but rather utilizes design information to correlate data associated with common features of a structure to provide sensitive, low-noise measurements.

In some cases, it may be sufficient to provide a scan pattern that crosses each instance of the structure a single time. As a result, the scan pattern may be expanded over a substantially larger FOV than would be required for typical structure-based averaging techniques. For instance, the FOV may be increased by expanding a length of each trace and/or increasing the spacing between traces. In this way, increasing the FOV may increase the number of instances of the structure in the FOV and thus increase the SNR of the design-assisted composite data. As another illustration in the context of an imaging metrology tool, the FOV may similarly be expanded to increase the number of instances of the structure in the FOV and thus increase the SNR of the design-assisted composite data. In some cases, the FOV may be expanded asymmetrically to provide a relatively high resolution along an axis of measurement and allow a relatively lower resolution in an orthogonal direction since resolution in this direction is not necessarily required.

It is further contemplated herein that increasing the FOV of a measurement may further provide a benefit of reducing an exposure dose (e.g., incident energy per area) on the sample during a measurement and thus limiting or mitigating potential damage to the sample from the measurement. For example, samples such as, but not limited to, photomasks have particularly low damage thresholds, which may limit the exposure dose used for metrology. In some cases, large FOV metrology using design-assisted composite data may allow the use of relatively higher intensities of an illumination beam while maintaining an exposure dose below a damage threshold of the sample or any structures thereon.

It is further contemplated herein that an accuracy or sensitivity of design-assisted composite data may be influenced by the ability to accurately correlate detection signals associated with common features on multiple instances of the structure of interest. In some embodiments, various alignment marks may be present in design data and also be fabricated on the sample to facilitate the accurate correlation between detection signals and location on the sample (e.g., referenced to design data). For example, measurement of alignment marks on the sample with precisely determined design positions located at or near an FOV of the metrology tool may facilitate accurate correlation of the detection signals to location on the sample and thus design data. In some embodiments, the position of a translation stage (e.g., used to align the sample with the FOV of the metrology tool) may be tightly tracked (e.g., using one or more interferometers). In this way, a correlation of the detection signals with location on the sample and thus design data may be provided with a higher degree of accuracy than provided by the translation stage itself. For example, U.S. Pat. No. 10,185,800 issued on Jan. 22, 2019, which is incorporated herein by reference in its entirety, generally describes tight positional tracking of a trace during scanning metrology and the use of design data as a reference for the measurement. In some embodiments, design data may be used both for the generation of design-assisted composite data as disclosed herein and as a reference for metrology using precise tracking of a scan trace as disclosed in U.S. Pat. No. 10,185,800.

Referring now to FIGS. 1A-4C, systems and methods for metrology with design-assisted composite data are described, in accordance with one or more embodiments of the present disclosure.

FIG. 1A is a conceptual view of a metrology system 100 providing design-assisted composite data, in accordance with one or more embodiments of the present disclosure.

In some embodiments, the metrology system 100 includes a metrology tool 102 including an illumination source to illuminate a sample 104 with an illumination beam 106 from an illumination source 108 and at least one detector 110 to generate detection signals associated with a measurement FOV in response to the illumination beam 106. In some embodiments, the metrology tool 102 further includes at least one translation stage 112 to secure and/or position the sample 104 with respect to the metrology tool 102. For example, the stage 112 may include, but is not limited to, one or more linear actuators, one or more rotational actuators, or one or more tip/tilt actuators to translate or otherwise position the sample 104 with respect to the illumination beam 106.

Figure 1B:
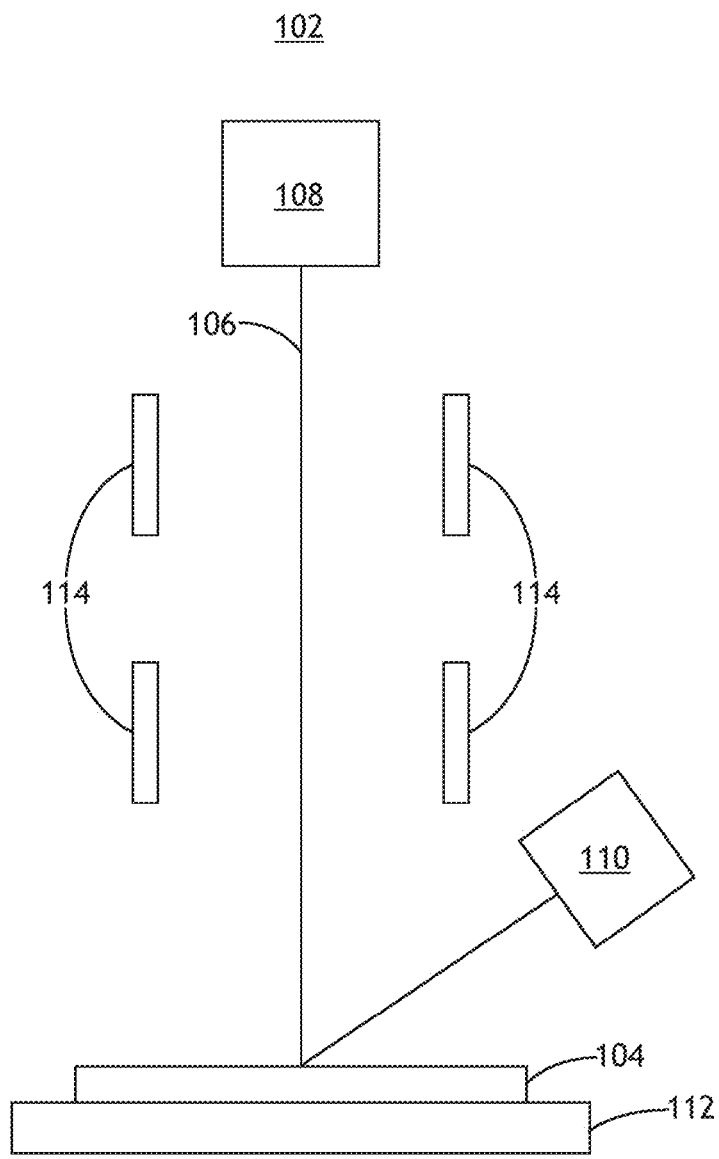
FIG. 1B is a conceptual view of a particle-based scanning metrology tool, in accordance with one or more embodiments of the present disclosure.
Figure 1C:
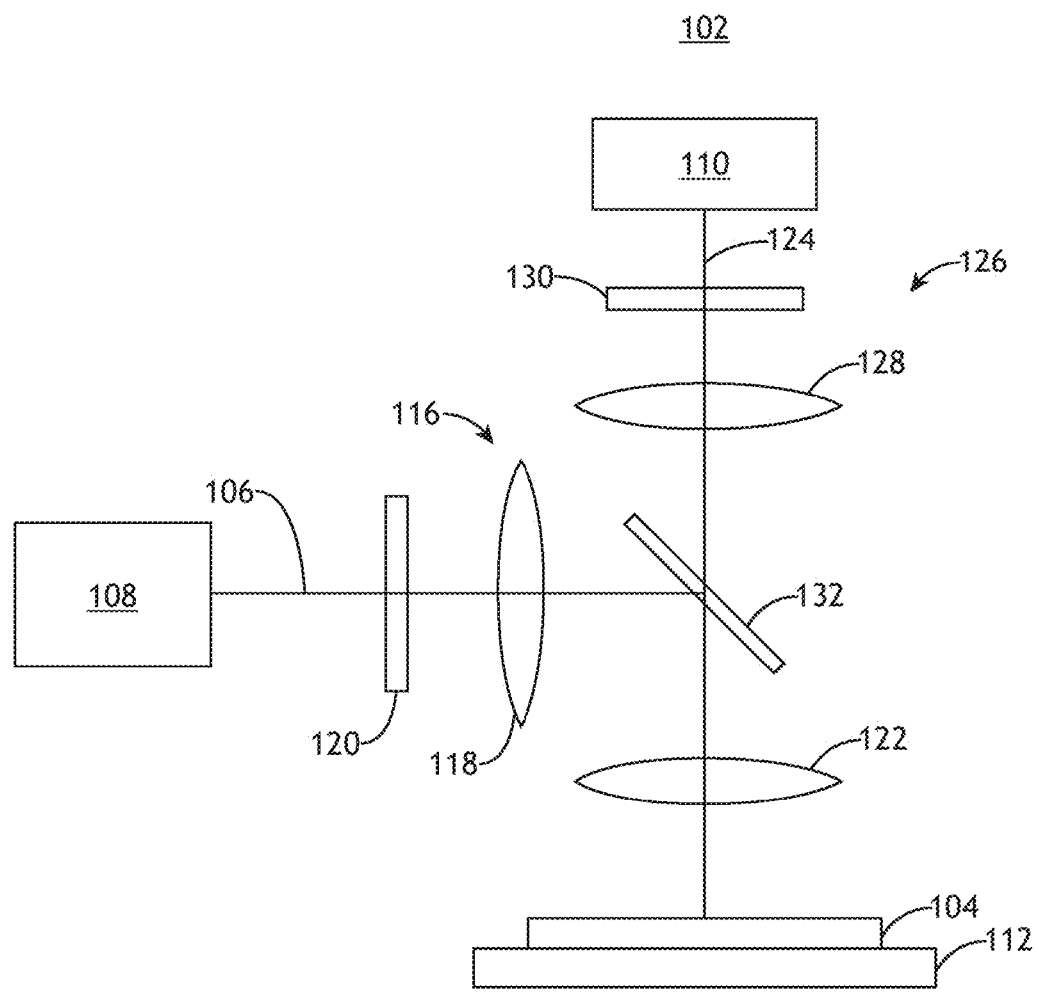
FIG. 1C is a conceptual view of an imaging metrology tool, in accordance with one or more embodiments of the present disclosure.

Referring now to FIGS. 1B and 1C, various aspects of the metrology tool 102 are described in greater detail, in accordance with one or more embodiments of the present disclosure. The metrology tool 102 may include any type of metrology tool known in the art.

In some embodiments, the metrology tool 102 is a scanning metrology tool, which may generate detection signals by scanning the illumination beam 106 in a scan pattern across the FOV and generate detection signals for various points along the scan pattern. In this configuration, a resolution of the metrology measurement (e.g., the detection signals) may be associated with the scan speed and/or a sampling rate during a scan. For example, the metrology tool 102 may include a scanner to scan the illumination beam 106 across the FOV, where the scanner may further include any combination of elements suitable for scanning the illumination beam 106 relative to the sample 104, scanning the sample 104 relative to the illumination beam 106, or any combination thereof to provide a desired scan path. For example, the scanner may include one or more translation stages such as, but not limited to, one or more linear actuators, one or more rotational actuators, or one or more tip/tilt actuators to translate or otherwise position the sample 104 with respect to the illumination beam 106. By way of another example, the scanner may include one or more beam-deflecting elements to deflect the illumination beam 106 along any desired path such as, but not limited to, particle deflectors, translatable mirrors, rotatable mirrors (e.g., galvanometers), or deformable components.

In some embodiments, the metrology tool 102 is an imaging metrology tool, which may generate detection signals by illuminating the entire FOV with the illumination beam 106 and capture an image of the FOV with the detector 110. In this case, the resolution may be associated with imaging optics used to generate the image of the sample on the detector 110.

The metrology tool 102 may further provide any type of illumination beam 106 known in the art including, but not limited to, a photon beam (e.g., a light beam) or a particle beam (e.g., an electron beam, an ion beam, a neutral particle beam, or the like).

Further, the metrology tool 102 may be formed as a single tool or a combination of tools. In this way, the metrology tool 102 may selectably provide different operational modes (e.g., scanning operation or imaging operation) and/or different illumination beams (e.g., light beams or particle beams).

FIG. 1B is a conceptual view of a particle-based metrology tool 102, in accordance with one or more embodiments of the present disclosure.

In some embodiments, the metrology tool 102 includes a particle illumination source 108 (e.g., an electron beam source, an ion beam source, a neutron beam source, or the like) to generate the particle-based illumination beam 106 (e.g., an electron beam, a particle beam, or the like). The particle illumination source 108 may include any particle source known in the art suitable for generating a particle-based illumination beam 106. For example, the particle illumination source 108 may include, but is not limited to, an electron gun or an ion gun. In some embodiments, the particle illumination source 108 is configured to provide a particle beam with a tunable energy. For example, a particle illumination source 108 including an electron source may, but is not limited to, provide an accelerating voltage in the range of 0.1 kV to 30 kV. As another example, a particle illumination source 108 including an ion source may, but is not required to, provide an ion beam with an energy in the range of 1 to 50 keV.

In some embodiments, the metrology tool 102 includes one or more particle focusing elements 114. For example, the one or more particle focusing elements 114 may include, but are not limited to, a single particle focusing element or one or more particle focusing elements forming a compound system. In some embodiments, the one or more particle focusing elements 114 include a particle objective lens configured to direct the illumination beam 106 to the sample 104, which may be located on the stage 112. Further, the metrology tool 102 may include any type of electron lenses known in the art including, but not limited to, electrostatic, magnetic, uni-potential, or double-potential lenses.

The metrology tool 102 may include any number or type of detectors 110 suitable for characterizing the sample 104 in response to the illumination beam 106 during a scan. In some embodiment, the metrology tool 102 includes an electron collector (e.g., a secondary electron collector, a backscattered electron detector, or the like). In some embodiments, the metrology tool 102 includes a photon detector (e.g., a photodetector, an x-ray detector, a scintillating element coupled to photomultiplier tube (PMT) detector, or the like) for detecting electrons and/or photons from the sample 104.

In some embodiments, though not shown, the metrology tool 102 includes one or more collection lenses to capture emission from the sample 104 and direct it to a detector 110. For example, the objective lens may operate as a collection lens to collect emission from the sample 104. Further, one or more collection elements (e.g., one or more additional lenses, a beam deflector, or the like) may direct the emission to a detector 110.

It is to be understood that the description of a metrology tool 102 as depicted in FIG. 1B and the associated descriptions above are provided solely for illustrative purposes and should not be interpreted as limiting. For example, the metrology tool 102 may include a multi-beam and/or a multi-column system suitable for simultaneously interrogating a sample 104. In some embodiments, the metrology tool 102 may include one or more components (e.g., one or more electrodes) configured to apply one or more voltages to one or more locations of the sample 104. In this regard, the metrology tool 102 may generate voltage contrast imaging data.

Additionally, in some embodiments, the metrology tool 102 is a light-based metrology tool in which the illumination beam 106 is a light beam. For example, the metrology tool 102 may include a scanning near-field optical microscope (SNOM) or near-field scanning optical microscope (NSOM) in which the illumination beam 106 is formed using a tip with a sub-wavelength aperture. By way of another example, the metrology tool 102 may include one or more focusing elements such as, but not limited to, lenses or mirrors to focus light to a desired spot size.

FIG. 1C is a conceptual view of an imaging metrology tool 102, in accordance with one or more embodiments of the present disclosure.

In one embodiment, the metrology tool 102 includes a photon illumination source 108 (e.g., a light source) configured to generate the illumination beam 106. The illumination source 108 may include any type of illumination source suitable for providing at least one illumination beam 106. The illumination from the illumination source 108 may include one or more selected wavelengths of electromagnetic radiation including, but not limited to, gamma rays, X-rays, ultraviolet (UV) wavelengths, visible wavelengths, infrared (IR) wavelengths, microwaves, or radio waves. In one embodiment, the illumination source 108 is a laser source. For example, the illumination source 108 may include, but is not limited to, one or more narrowband laser sources, a broadband laser source, a supercontinuum laser source, a white light laser source, or the like. In this regard, the illumination source 108 may provide an illumination beam 106 having high coherence (e.g., high spatial coherence and/or temporal coherence). In another embodiment, the illumination source 108 includes a laser-sustained plasma (LSP) source. For example, the illumination source 108 may include, but is not limited to, a LSP lamp, a LSP bulb, or a LSP chamber suitable for containing one or more elements that, when excited by a laser source into a plasma state, may emit broadband illumination. In another embodiment, the illumination source 108 includes a lamp source. For example, the illumination source 108 may include, but is not limited to, an arc lamp, a discharge lamp, an electrodeless lamp, or the like. In this regard, the illumination source 108 may provide an illumination beam 106 having low coherence (e.g., low spatial coherence and/or temporal coherence).

In another embodiment, the metrology tool 102 directs the illumination beam 106 to the sample 104 via an illumination pathway 116. The illumination pathway 116 may include one or more optical components suitable for modifying and/or conditioning the illumination beam 106 as well as directing the illumination beam 106 to the sample 104. In one embodiment, the illumination pathway 116 includes one or more illumination sub-system lenses 118 (e.g., to collimate the illumination beam 106, to relay pupil and/or field planes, or the like). In another embodiment, the illumination pathway 116 includes one or more illumination sub-system control optics 120 to shape or otherwise control the illumination beam 106. For example, the illumination sub-system control optics 120 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In another embodiment, the metrology tool 102 includes an objective lens 122 to focus the illumination beam 106 onto the sample 104. In another embodiment, the sample 104 is disposed on the stage 112 configured to position the sample 104 with respect to the illumination beam 106.

In another embodiment, the metrology tool 102 includes at least one detector 110 to capture light or other illumination emanating from the sample 104 (e.g., collection light 124) through an imaging pathway 126. The imaging pathway 126 may include one or more optical elements suitable for modifying and/or conditioning the collection light 124 from the sample 104. In one embodiment, the imaging pathway 126 includes one or more imaging sub-system lenses 128 (e.g., to collimate the illumination beam 106, to relay pupil and/or field planes, or the like), which may include, but is not required to include, the objective lens 122. In another embodiment, the imaging pathway 126 includes one or more imaging sub-system control optics 130 to shape or otherwise control the collection light 124. For example, the imaging sub-system control optics 130 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

A detector 110 may be located at any selected location within the imaging pathway 126. In one embodiment, the metrology tool 102 includes a detector 110 at a field plane (e.g., a plane conjugate to the sample 104) to generate a field-plane image of the sample 104. In another embodiment, the metrology tool 102 includes a detector 110 at a pupil plane (e.g., a diffraction plane) to generate a pupil-plane image. In this regard, the pupil image may correspond to an angular distribution of light from the sample 104.

The illumination pathway 116 and the imaging pathway 126 of the metrology tool 102 may be oriented in a wide range of configurations suitable for illuminating the sample 104 with the illumination beam 106 and collecting light emanating from the sample 104 in response to the incident illumination beam 106. For example, as illustrated in FIG. 1C, the metrology tool 102 may include a beamsplitter 132 oriented such that a common objective lens 122 may simultaneously direct the illumination beam 106 to the sample 104 and collect light from the sample 104 (e.g., the collection light 124). By way of another example, the illumination pathway 116 and the imaging pathway 126 may contain non-overlapping optical paths.

Referring again to FIG. 1A, in some embodiments, the metrology tool 102 includes a controller 134 coupled to the metrology tool 102, or any components thereof. In this way, the controller 134 may receive data from the metrology tool 102 and/or provide control signals to the metrology tool 102 to direct the metrology tool 102 to perform an action.

The controller 134 may include one or more processors 136 configured to execute program instructions maintained on a memory 138 (e.g., a memory medium). In this regard, the controller 134 (e.g., via the one or more processors 136) may execute any of the various process steps described throughout the present disclosure. As non-limiting illustrations, the controller 134 may provide a desired scan path to the metrology tool 102, direct the metrology tool 102 to generate measurements, receive detection data from the metrology tool 102, generate device-assisted composite data associated with one or more structures of interest, or generate metrology data for the one or more structures based on the device-assisted composite data.

The one or more processors 136 of a controller 134 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 136 may include any device configured to execute algorithms and/or instructions (e.g., program instructions stored in memory). In some embodiments, the one or more processors 136 may be embodied as a desktop computer, mainframe computer system, workstation, image computer, parallel processor, networked computer, or any other computer system configured to execute a program configured to operate or operate in conjunction with the metrology system 100, as described throughout the present disclosure.

The memory 138 may include any storage medium known in the art suitable for storing program instructions executable by the associated one or more processors 136. For example, the memory 138 may include a non-transitory memory medium. By way of another example, the memory 138 may include, but is not limited to, a read-only memory (ROM), a random-access memory (RAM), a magnetic or optical memory device (e.g., disk), a magnetic tape, a solid-state drive and the like. It is further noted that memory 138 may be housed in a common controller housing with the one or more processors 136. In some embodiments, the memory 138 may be located remotely with respect to the physical location of the one or more processors 136 and controller 134. For instance, the one or more processors 136 of controller 134 may access a remote memory (e.g., server), accessible through a network (e.g., internet, intranet and the like).

The controller 134 or any components thereof (e.g., the processors 136, memory 138, or the like) may be provided within a common housing or within multiple housings. In this way, any controller or combination of controllers may be separately packaged as a module suitable for integration into the metrology tool 102. Further, various aspects of the controller 134 may be provided as dedicated components or integrated within other components of the metrology tool 102.

In this way, the above description should not be interpreted as a limitation on the embodiments of the present disclosure but merely as an illustration. Rather, the controller 134 illustrated in FIG. 1A may generally refer to a single controller or multiple controllers such that the various process steps described throughout the present disclosure may be performed on a single controller.

In some embodiments, a user interface 140 is communicatively coupled to the controller 134. In some embodiments, the user interface 140 may include, but is not limited to, one or more desktops, laptops, tablets, and the like. In some embodiments, the user interface 140 includes a display used to display data of the metrology tool 102 to a user. The display of the user interface 140 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 140 is suitable for implementation in the present disclosure. In some embodiments, a user may input selections and/or instructions responsive to data displayed to the user via a user input device of the user interface 140.

Referring now to FIGS. 2-4C, various noise mitigation techniques in metrology are described in greater detail, in accordance with one or more embodiments of the present disclosure.

It is contemplated herein that fabricated features on a sample 104 may exhibit stochastic variations associated with fluctuations and variations during various fabrication steps and/or materials used during fabrication. As an illustration, line edge roughness (LER) may be associated with variations along an edge of a fabricated structure. As another illustration, line width roughness (LWR) may be associated with variations of a width of a structure.

In some metrology applications, these stochastic variations may be considered to be noise that reduce the signal to noise ratio, the measurement sensitivity, and/or the measurement accuracy. Common but non-limiting examples include measurements of the shape, orientation, or position of fabricated structures such as, but not limited to, critical dimension (CD) measurements, position (e.g., registration) measurements, or overlay measurements.

Figure 2:
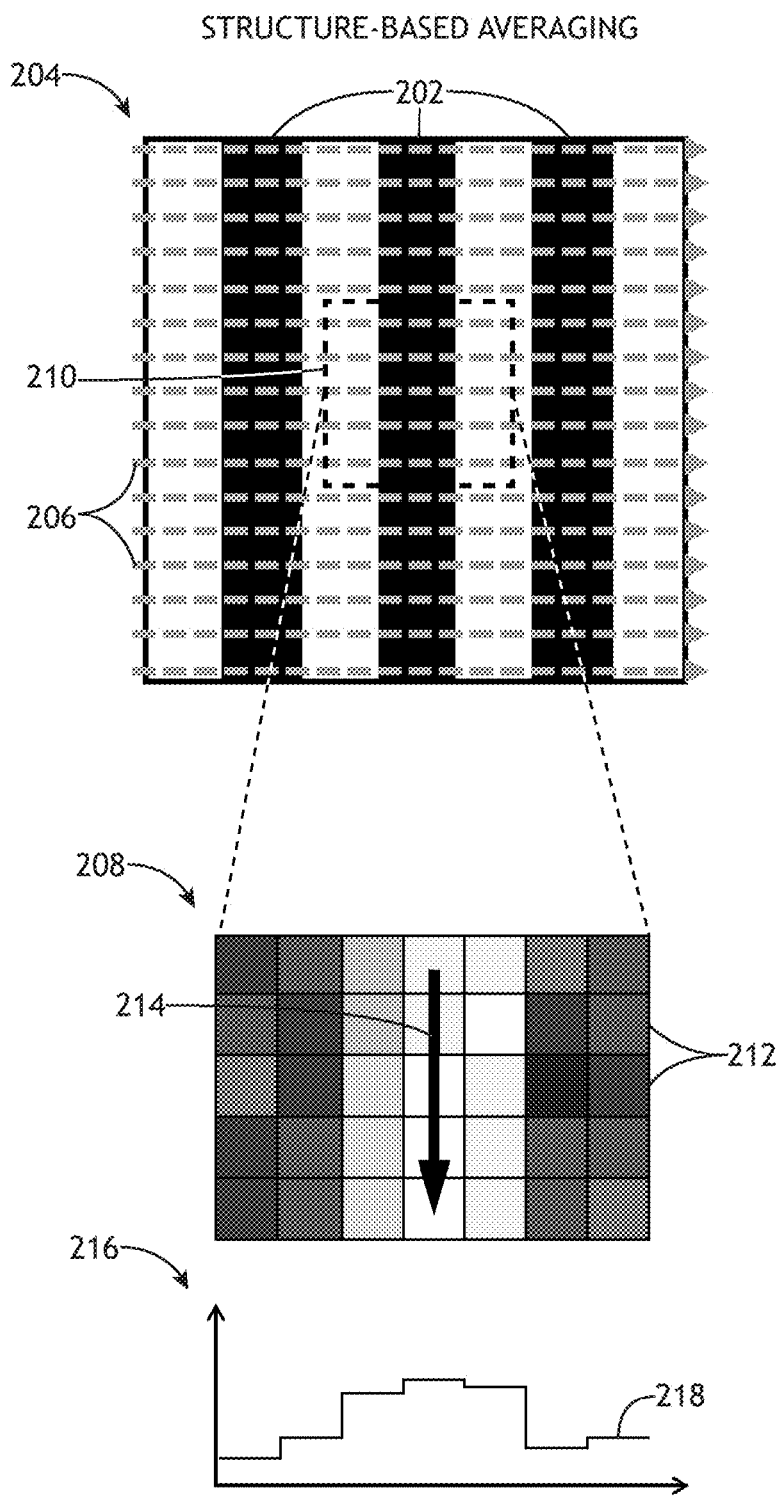
FIG. 2 is a conceptual illustration of a conventional image-based averaging technique for metrology, in accordance with one or more embodiments of the present disclosure.

FIG. 2 is a conceptual illustration of a conventional structure-based averaging technique for scanning metrology, in accordance with one or more embodiments of the present disclosure. In particular, FIG. 2 illustrates averaging multiple measurements on different locations of a line structure 202.

As illustrated in FIG. 2, a typical scanning metrology process may include generating a high-resolution image 204 of the sample 104 including at least one instance of a structure of interest (here, three instances of a line structure 202) using a dense array of linear traces 206 across an FOV. In this way, multiple traces 206 generate data associated with a particular line structure 202 at different locations. For example, the inset 208 illustrates a conceptual depiction of detection signals associated with five traces 206 at different locations along the line structure 202 (e.g., five rows of the image 204) with a region of interest 210. In this inset 208, each pixel 212 represents a measurement along a trace 206 and variations of the values of the pixels 212 along traces 206 corresponds to stochastic noise.

In this typical structure-based averaging technique, the stochastic noise may be mitigated by averaging data along a direction orthogonal to the traces 206 (here, the vertical direction 214). The inset 216 illustrates a conceptual plot of such structure-averaged data 218.

However, it is contemplated herein that the structure-based averaging technique illustrated in FIG. 2 may suffer from various limitations. For example, the number of data points available to average is limited by a number of traces 206 on any particular instance of a structure of interest, which may in turn be limited by the size, shape, or geometry of the structure. While FIG. 2 illustrates line structures filling the FOV of the image 204, the structures of interest may generally have any shape, size or orientation. As a result, the number of data points available for averaging may be much more limited in practice. By way of another example, the number of traces 206 (and thus the number of datapoints available for averaging) may not be increased arbitrarily. Rather, the density of the traces 206 and thus the number of data points available for averaging may be limited by the damage threshold of the sample 104 or structures thereon. As an illustration, photomasks (e.g., resists) may have relatively low damage thresholds that may severely limit the effectiveness of image-based averaging techniques. By way of a further example, the generation of such high-resolution images may typically be time consuming, which may limit the size of the FOV and the measurement throughput overall.

Although FIG. 2 illustrates the particular case of scanning-based metrology, it is further contemplated herein that structure-based averaging using imaging-based metrology may suffer from similar limitations. For example, acquiring an image of the sample 104 with sufficient resolution to provide structure-based averaging may limit the FOV, which may in turn limit the measurement throughput and increase the potential for inducing damage to the sample 104 during a measurement.

Figure 3:
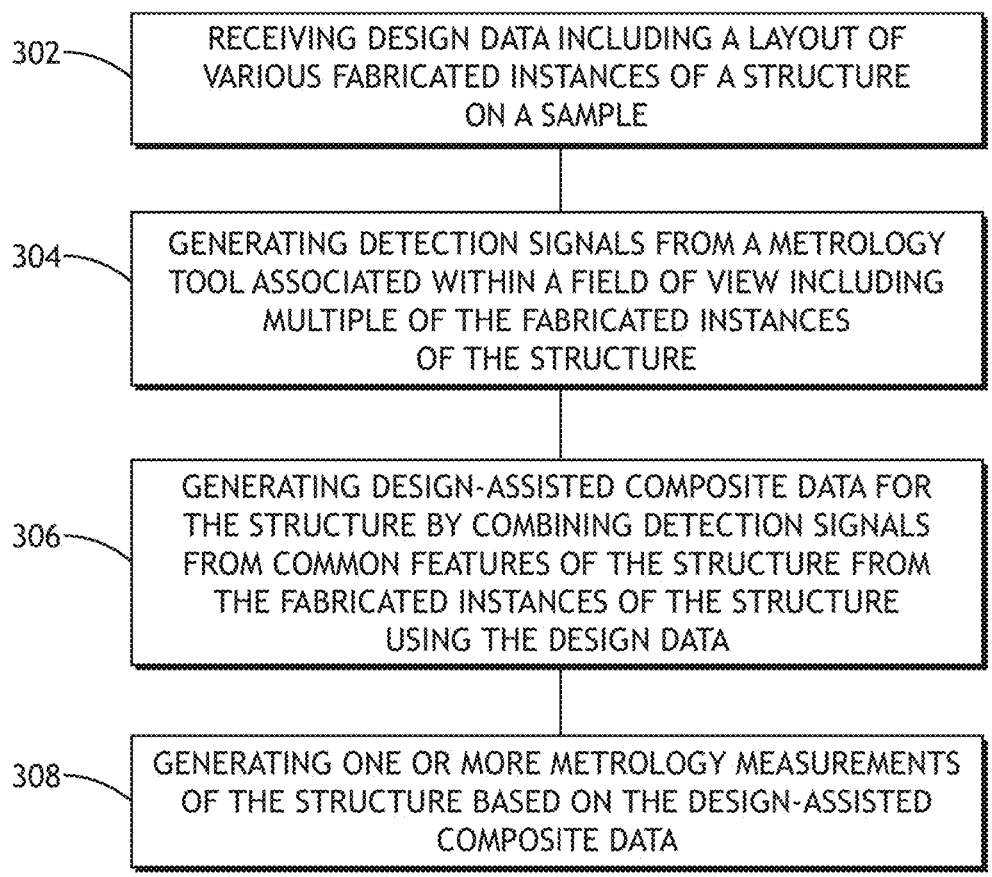
FIG. 3 is a flow diagram illustrating steps performed in a method for metrology using design-assisted composite data, in accordance with one or more embodiments of the present disclosure.
Figure 4A:
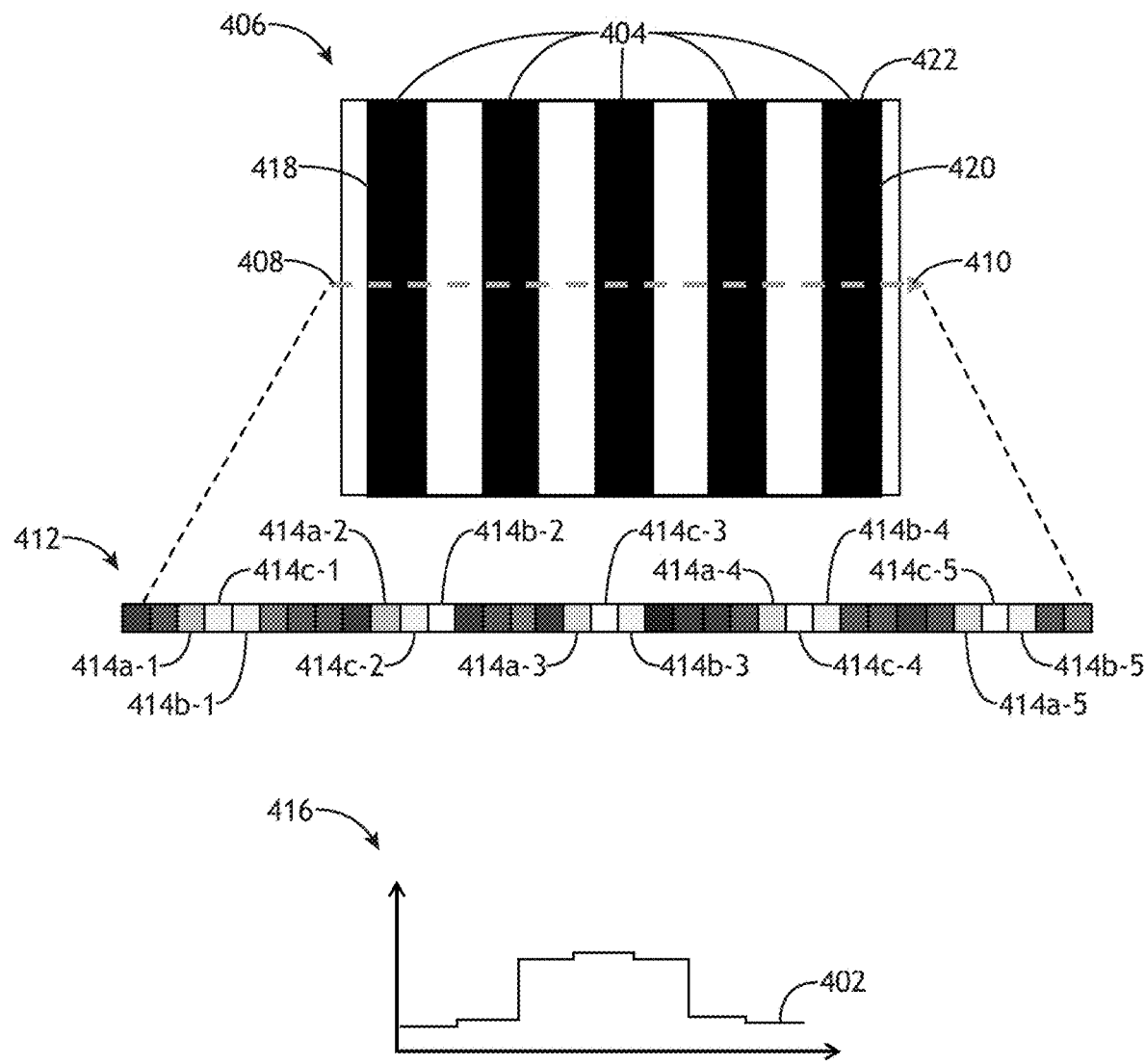
FIG. 4A is a conceptual illustration of the generation of design-assisted composite data for repeated instances of a line structure, in accordance with one or more embodiments of the present disclosure.
Figure 4B:
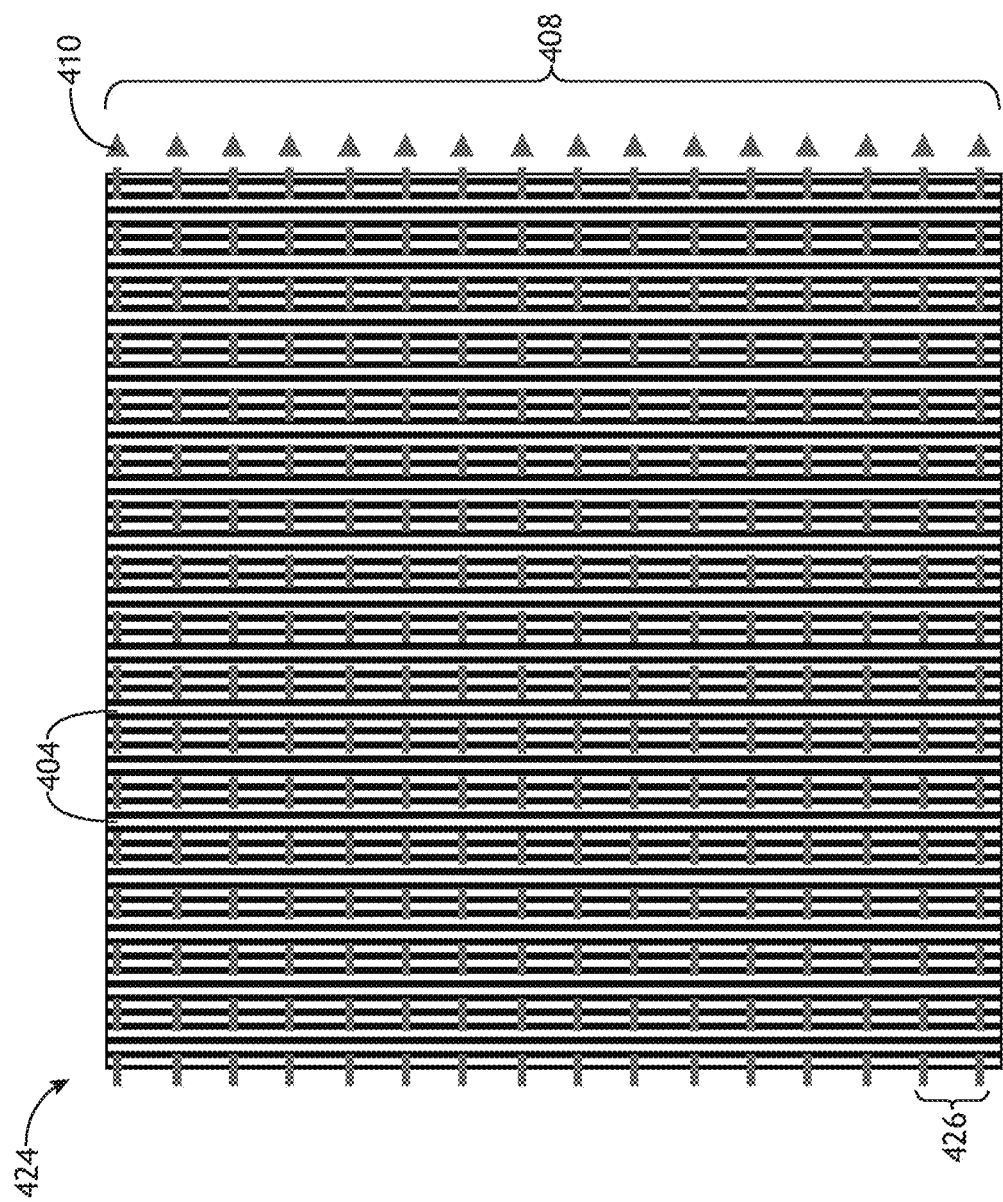
FIG. 4B is a conceptual illustration of a full scan pattern for the generation of design-assisted composite data formed as a sparse array of line structures 404 across a large FOV, in accordance with one or more embodiments of the present disclosure.
Figure 4C:
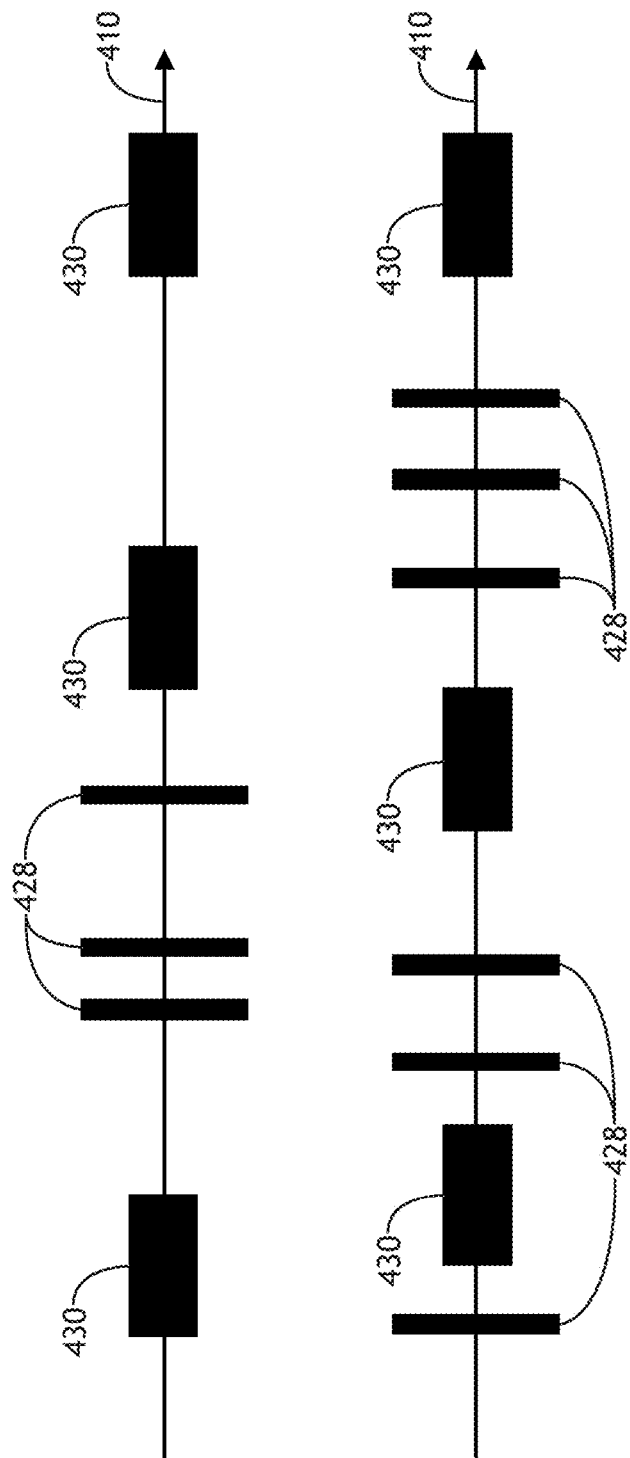
FIG. 4C is a conceptual illustration of design-assisted composite data for multiple structure types, in accordance with one or more embodiments of the present disclosure.

Referring now to FIGS. 3-4C, metrology using design-assisted composite data is described in greater detail, in accordance with one or more embodiments of the present disclosure. FIG. 3 is a flow diagram illustrating steps performed in a method 300 for metrology using design-assisted composite data, in accordance with one or more embodiments of the present disclosure. Applicant notes that the embodiments and enabling technologies described previously herein in the context of the metrology tool 102 should be interpreted to extend to the method 300. It is further noted, however, that the method 300 is not limited to the architecture of the metrology system 100.

It is contemplated herein that semiconductor fabrication typically involves fabrication of multiple (and sometimes many) repeated instances of structures across various material layers on a wafer, where the repeated instances of the structures are intended to be identical. For example, a semiconductor device may include many repeated instances of functional structures such as, but not limited to, transistors, memory devices, or the like. Further these functional structures may themselves include repeated instances of various sub-structures.

It is further contemplated herein that the presence of repeated instances of structures of interest may be exploited to provide sensitive, high-throughput metrology. In particular, data associated with common features (e.g., locations) of multiple instances of a structure of interest may be combined based on design data including the intended locations and/or orientations of the various instances of the structure across the sample 104. As described previously herein, such data may be referred to as design-assisted composite data. In this way, the number of data points available for combination (e.g., by averaging or any other statistical combination) may be limited only by the number of instances of the structure of interest for which detection signals are generated. Further, there is no requirement that a high-resolution image of any particular structure be generated. In fact, a single trace across each instance of a structure may suffice in some scanning-based applications. As a result, the FOV and thus the exposure dose may be substantially reduced, which may enable measurements with relatively high intensities without inducing damage and/or relatively high measurement throughput.

In some embodiments, the method 300 includes a step 302 of receiving design data including a layout of various fabricated instances of a structure on a sample 104. The sample 104 described herein in the context of the method 300 and/or the metrology system 100 may broadly include a semiconductor device at any stage of fabrication including repeated instances of various fabricated structures, a photomask (e.g., a resist) including repeated instances of photomask structures used in the fabrication process, or any other material including repeated instances of one or more structures of interest.

The design data may include any type of data from any source providing information about the intended layout of a structure of interest on the sample 104 including, but not limited to, locations of the structure, a shape of the structure, or an orientation of the structure at each location. For example, the design data may include schematics of the sample 104 used to guide the fabrication of various layers (e.g., GDS data, or the like), metrology measurements of the sample 104 taken at the current or any previous process step, or a combination thereof.

In some embodiments, the method 300 includes a step 304 of generating detection signals from a metrology tool 102 associated within a field of view including multiple of the fabricated instances of the structure.

The metrology tool 102 may include any type of metrology tool suitable for generating detection signals for multiple instances of a structure of interest. In some embodiments, the step 304 of generating detection signals includes scanning an illumination beam 106 along a scan pattern with respect to the sample 104 (e.g., using the metrology tool 102, or the like), where the scan pattern crosses at least one common feature on the plurality of fabricated instances of the structure on the sample 104. The scan pattern may include any type or design of traces suitable for intersecting with at least one common feature of the instances of the structure to be measured. For example, the scan pattern may include one or more linear scan traces, which may be, but are not required to be, parallel. By way of another example, the scan pattern may include one or more curved scan traces. In some embodiments, the step 304 of generating detection signals includes illuminating at least the field of view with an illumination beam 106 and capturing an image of the field of view based on the illumination.

In some embodiments, the method 300 includes a step 306 of generating design-assisted composite data for the structure by combining detection signals from common features of the structure from the plurality of fabricated instances of the structure using the design data. For example, the design data may be used to correlate detection signals generated in step 304 to particular locations on the sample 104 thus to particular features on the sample 104. The step 306 of generating design-assisted composite data may then include correlating and/or combining data points associated with common features of the structure of interest across multiple instances of the structure. The design-assisted composite data may then include any statistical combination of detection signals from the common features of the structure such as, but not limited to, average values. Further, a common feature across multiple instances of a structure may include any feature of the structure such as, but not limited to, an edge or a center position.

In some embodiments, the method 300 includes a step 308 of generating one or more metrology measurements of the structure based on the design-assisted composite data. It is contemplated herein that, the generation of design-assisted composite data based on statistically combining (e.g., averaging, or the like) signals from multiple instances of the structure may effectively mitigate or otherwise suppress stochastic noise associated with the fabrication process, which may be beneficial in certain applications. In a general sense, any type of metrology measurement may be generated based on design-assisted composite data. For example, design-assisted composite data may be used for measurements of the size and/or shape of the structure (e.g., CD metrology, or the like). By way of another example, design-assisted composite data may be used for positional measurements of the structure such as, but not limited to, pattern placement error (PPE) measurements. By way of another example, design-assisted composite data may be used for overlay measurements associated with relative positions of structures fabricated in different exposures on the same or different sample layers. By way of another example, design-assisted composite data may be used for edge measurements of certain features of the structure such as, but not limited to, pattern placement error measurements. For instance, design-assisted composite data may be generated for instances of both a first structure of interest and a second structure of interest on a sample 104. In this way, the various instances of the first and second structures of interest may form an overlay target. An overlay measurement may thus be associated with relative position measurements of the first and second structures of interest (and optionally an anchor measurement).

Referring now to FIGS. 4A-4C, the generation of design-assisted composite data is described in greater detail, in accordance with one or more embodiments of the present disclosure. In particular, FIGS. 4A and 4B illustrate the generation of design-assisted composite data 402 for a line structure 404 (e.g., a structure of interest for metrology), while FIG. 4C illustrates the generation of design-assisted composite data 402 for multiple structure types within an FOV. It is noted herein that although FIGS. 4A-4C illustrate a particular example of design-assisted composite data 402 generated using a metrology tool 102, it is to be understood that FIGS. 4A-4C are provided solely for illustrative purposes and should not be interpreted as limiting. Rather, design-assisted composite data 402 may be generated based on data from any type of metrology tool 102 including, but not limited to, an image-based metrology tool 102.

FIG. 4A is a conceptual illustration of the generation of design-assisted composite data 402 for repeated instances of a line structure 404, in accordance with one or more embodiments of the present disclosure. The inset 406 illustrates five instances of the line structure 404 and a portion of a scan pattern 408 (e.g., a linear trace 410) across the various instances of the line structure 404.

The inset 412 is a schematic view of detection signals generated by a scanning metrology tool 102 along the portion of the scan pattern 408 shown in FIG. 3A (e.g., via steps 304 and 306 of the method 300), in accordance with one or more embodiments of the present disclosure. For example, the detection signals include a series of pixels 414 associated with a sampling rate of the scanning metrology tool 102. As described previously herein, the metrology tool 102 may utilize any type of illumination beam 106 known in the art such as a particle beam (e.g., an electron beam, an ion beam, a neutral particle beam, or the like) or a light beam of any wavelength.

The inset 416 is an illustrative plot of design-assisted composite data 402 generated using the detection signals and design data associated with the layout of the line structures 404. For example, the design-assisted composite data 402 may be generated (e.g., in step 308 of the method 300) by using the design data to correlate particular pixels 414 of the detection signals associated with common features of the line structures 404.

As an illustration, pixels 414a-1, 414a-2, . . . 414a-5 may be associated with a left edge 418 of a line structure 404 (e.g., a first common feature), while pixels 414b-1, 414b-2, . . . 414b-5 may be associated with a right edge 420 of a line structure 404 (e.g., a second common feature). Similarly, the pixels 414c-1, 414c-2, . . . 414c-5 may be associated with a central portion 422 of a line structure 404 (e.g., a third common feature). The correlated pixels 414 may then be combined into the design-assisted composite data 402 using any statistical combination such as, but not limited to, averaging the correlated pixels 414. In this way various sources of stochastic noise such as, but not limited to, LER or LWR may be mitigated or otherwise suppressed. The design-assisted composite data 402 may then be used as the basis for any number or type of metrology measurements of the line structure 404 of interest. For instance, the design-assisted composite data 402 illustrated in the inset 416 may be utilized for metrology measurements such as, but not limited to, a position of the left edge 418, a position of the right edge 420, a width of the line structure 404 (e.g., a CD measurement), or lateral position along the direction of the linear trace.

As illustrated in FIG. 4A, design-assisted composite data 402 may be generated without generating a conventional high-resolution image of any particular instance of a structure of interest (e.g., the line structure 404 in FIG. 4A). Rather, the design-assisted composite data 402 is built up by measurements of common features on many different instances of the structure of interest. It is contemplated herein that metrology based on design-assisted composite data 402 as disclosed herein may thus beneficially provide high sensitivity and high throughput while also limiting damage of the sample 104 during the measurement process. In particular, the generation of design-assisted composite data 402 enables substantial flexibility for tailoring the scan pattern 408 for a particular application or sample layout. For example, the scan pattern 408 may include one or more traces 410 of arbitrary length or curvature. By way of another example, the scan pattern 408 may include a sparse distribution of traces 410. Further, a scan pattern 408 may be designed to limit the exposure dose on the sample 104. For instance, the scan pattern 408 may be designed to limit to the exposure dose to a level below a damage threshold of the sample 104 or any structures thereon.

FIG. 4B is a conceptual illustration of a full scan pattern 408 for the generation of design-assisted composite data 402 formed as a sparse array of line structures 404 across a large FOV 424, in accordance with one or more embodiments of the present disclosure. As illustrated in FIG. 4B, the generation of design-assisted composite data 402 enables the scan pattern 408 to be tailored to cross many instances of a structure of interest (here, a line structure 404) across a wide FOV 424, which may further beneficially provide a relatively low exposure dose on the sample 104. As an illustration, the total available signal associated with the scan pattern 408 in FIG. 4B (e.g., total number of sample points generated along the scan pattern 408) may be the same as for the conventional image-based averaging in FIG. 2; however, the area of the FOV 424 in FIG. 4B may be 2,500 times greater than in FIG. 2 due to the larger spacing 426 between traces 410 and the longer length of the traces 410. As a result, the exposure dose using design-assisted composite data 402 in this non-limiting example may be correspondingly reduced by 2,500 times. Further, the number of data points available for averaging using design-assisted composite data 402 is substantially greater than available for the conventional image-based averaging technique, which may result in a correspondingly higher signal to noise ratio and thus higher measurement sensitivity. In particular, design-assisted composite data 402 may be generated based on data from any of the traces 410 in the scan pattern 408 and are not limited to data from a single trace 410 as illustrated in FIG. 4A.

Referring again generally to FIGS. 3-4B, it is to be understood that FIGS. 3-4B and the associated descriptions are provided solely for illustrative purposes and should not be interpreted as limiting. For example, although FIGS. 4A and 4B illustrate metrology of a line structure 404 distributed periodically on the sample 104, there is no requirement that a structure of interest be periodically distributed on the sample 104. Rather, the structure of interest may be distributed in any pattern across the sample. Additionally, design-assisted composite data 402 may be generated for multiple types of structures captured in a given FOV.

FIG. 4C is a conceptual illustration of design-assisted composite data 402 for multiple structure types, in accordance with one or more embodiments of the present disclosure. In particular, FIG. 4C illustrates two traces 410 of a scan pattern 408 that cross over multiple instances of a first structure type 428 and multiple instances of a second structure type 430. Further, as described previously, it may be the case that the various instances of any structure type are not periodic. However, a first set of design-assisted composite data 402 may nonetheless be generated based on the captured instances of the first structure type 428 and a second set of design-assisted composite data 402 may be generated based on the captured instances of the second structure type 430 in any of the traces 410.

Additionally, it is to be understood that although the traces 410 in FIGS. 4A-4C are illustrated as linear, this is again merely an illustration and is not limiting. Rather, a scan pattern 408 may have any pattern and may include any number or combination of linear or curved traces 410.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
  a controller configured to be communicatively coupled to a metrology tool, the controller including one or more processors configured to execute program instructions causing the one or more processors to:

receive design data including a layout of fabricated instances of a structure on a sample;

receive detection signals from the metrology tool associated within a field of view including a plurality of the fabricated instances of the structure;

generate design-assisted composite data for the structure by combining detection signals from one or more common features of the structure associated with the plurality of fabricated instances of the structure within the field of view using the design data; and generate one or more metrology measurements of the structure based on the design-assisted composite data.

2. The metrology system of claim 1, wherein the combining detection signals from one or more common features of the structure associated with the plurality of fabricated instances of the structure within the field of view using the design data comprises:

averaging detection signals from the one or more common features of the structure associated with the plurality of instances of the structure within the field of view using the design data.

3. The metrology system of claim 1, wherein the metrology tool comprises:

a scanning metrology tool, wherein the detection data is generated by scanning an illumination beam across a field of view in a scan pattern.

4. The metrology system of claim 3, wherein the scan pattern comprises:

a plurality of traces.

5. The metrology system of claim 4, wherein at least one of the plurality of traces is linear.

6. The metrology system of claim 4, wherein at least one of the plurality of traces is curved.

7. The metrology system of claim 1, wherein the metrology tool comprises:

an imaging metrology tool, wherein the detection data is generated by imaging the sample with the field of view.

8. The metrology system of claim 1, wherein at least one of the one or more measurements of the structure comprises:

a critical dimension (CD) measurement of the structure.

9. The metrology system of claim 1, wherein at least one of the one or more measurements of the structure comprises:

a position measurement of the structure.

10. The metrology system of claim 1, wherein at least one of the one or more measurements of the structure comprises:

a position measurement of at least one of the one or more common features of structure.

11. The metrology system of claim 10, wherein the at least one of the one or more common features of structure comprises:

an edge of the structure.

12. The metrology system of claim 1, wherein the structure is a first structure, wherein the field of view further includes a plurality of fabricated instances of a second structure on the sample, wherein the first structure and the second structure form an overlay target, wherein the program instructions are further configured to cause the one or more processors to:

receive the design data including a layout of the plurality of fabricated instances of the second structure on the sample;

generate design-assisted composite data for the second structure by combining detection signals from one or more common features of the second structure associated with the plurality of fabricated instances of the second structure within the field of view using the design data; and generate an overlay measurement for the overlay target associated with position measurements of the first and second structures based on the design-assisted composite data for the first and second structures.

13. The metrology system of claim 1, wherein at least one of the one or more common features of the structure comprises:

an edge of the structure.

14. The metrology system of claim 1, wherein at least one of the one or more common features of the structure comprises:

a central portion of the structure.

15. The metrology system of claim 1, wherein the metrology tool includes a particle-beam illumination source.

16. The metrology system of claim 15, wherein the particle-beam illumination source comprises:

an electron beam source.

17. The metrology system of claim 15, wherein the particle-beam illumination source comprises:

at least one of an ion beam source or a neutral particle beam source.

18. The metrology system of claim 1, wherein the metrology tool includes a photon illumination source.

19. The metrology system of claim 1, wherein the field of view is selected to provide an exposure dose on the sample below a damage threshold of the sample.

20. A metrology system comprising:

a metrology tool;

a controller communicatively coupled to a metrology tool, the controller including one or more processors configured to execute program instructions causing the one or more processors to:

receive design data including a layout of a plurality of fabricated instances of a structure on a sample;

receive detection signals from a metrology tool associated within a field of view including a plurality of the fabricated instances of the structure;

generate design-assisted composite data for the structure by combining detection signals from one or more common features of the structure associated with the plurality of fabricated instances of the structure within the field of view using the design data; and generate one or more metrology measurements of the structure based on the design-assisted composite data.

21. The metrology system of claim 20, wherein the metrology tool includes a particle-beam illumination source.

22. The metrology system of claim 21, wherein the particle-beam illumination source comprises:

an electron beam source.

23. The metrology system of claim 21, wherein the particle-beam illumination source comprises:

at least one of an ion beam source or a neutral particle beam source.

24. The metrology system of claim 20, wherein the metrology tool includes a photon illumination source.

25. The metrology system of claim 20, wherein the combining detection signals from one or more common features of the structure associated with the plurality of fabricated instances of the structure within the field of view using the design data comprises:

averaging detection signals from the one or more common features of the structure associated with the plurality of instances of the structure within the field of view using the design data.

26. The metrology system of claim 20, wherein the metrology tool comprises:
a scanning metrology tool, wherein the detection data is generated by scanning an illumination beam across the field of view in a scan pattern.

27. The metrology system of claim 26, wherein the scan pattern comprises:
a plurality of traces.

28. The metrology system of claim 27, wherein at least one of the plurality of traces is linear.

29. The metrology system of claim 27, wherein at least one of the plurality of traces is curved.

30. The metrology system of claim 20, wherein the metrology tool comprises:
an imaging metrology tool, wherein the detection data is generated by imaging the sample with the field of view.

31. The metrology system of claim 20, wherein at least one of the one or more measurements of the structure comprises:
a critical dimension (CD) measurement of the structure.

32. The metrology system of claim 20, wherein at least one of the one or more measurements of the structure comprises:
a position measurement of the structure.

33. The metrology system of claim 20, wherein at least one of the one or more measurements of the structure comprises:
a position measurement of at least one of the one or more common features of structure.

34. The metrology system of claim 33, wherein the at least one of the one or more common features of structure comprises:
an edge of the structure.

35. The metrology system of claim 20, wherein the structure is a first structure, wherein the field of view further includes a plurality of fabricated instances of a second structure on the sample, wherein the first structure and the second structure form an overlay target, wherein the program instructions are further configured to cause the one or more processors to:
receive the design data including a layout of the plurality of fabricated instances of the second structure on the sample;
generate design-assisted composite data for the second structure by combining detection signals from one or more common features of the second structure associated with the plurality of fabricated instances of the second structure within the field of view using the design data; and
generate an overlay measurement for the overlay target associated with position measurements of the first and second structures based on the design-assisted composite data for the first and second structures.

36. The metrology system of claim 20, wherein at least one of the one or more common features of the structure comprises:
an edge of the structure.

37. The metrology system of claim 20, wherein at least one of the one or more common features of the structure comprises:
a central portion of the structure.

38. A metrology method comprising:
receiving design data including a layout of fabricated instances of a structure on a sample;
generating detection signals from a metrology tool associated within a field of view including a plurality of the fabricated instances of the structure;
generating design-assisted composite data for the structure by combining detection signals from one or more common features of the structure associated with the plurality of fabricated instances of the structure within the field of view using the design data; and
generating one or more metrology measurements of the structure based on the design-assisted composite data.

39. The metrology method of claim 38, wherein combining detection signals from one or more common features of the structure associated with the plurality of fabricated instances of the structure within the field of view using the design data comprises:
averaging detection signals from the one or more common features of the structure associated with the plurality of instances of the structure within the field of view using the design data.

40. The metrology method of claim 38, wherein at least one of the one or more measurements of the structure comprises:
at least one of a critical dimension (CD) measurement of the structure, a position measurement of the structure, or a position measurement of at least one of the one or more common features of the structure.

41. The metrology method of claim 38, wherein at least one of the one or more common features of the structure comprises:
at least on of an edge of the structure or a central portion of the structure.

* * * * *